United States Patent [19]

Harris et al.

[11] 4,233,092
[45] Nov. 11, 1980

[54] UTILIZING LEAD COMPOUNDS OF SULPHUR, SELENIUM AND TELLURIUM AS DOPANT SOURCES

[75] Inventors: Jeffrey J. Harris, Crawly, England; Colin E. C. Wood, Freeville, N.Y.

[73] Assignee: U.S. Philips Corporation, New York, N.Y.

[21] Appl. No.: 74,617

[22] Filed: Sep. 12, 1979

[30] Foreign Application Priority Data

Sep. 22, 1978 [GB] United Kingdom ............ 37800/78

[51] Int. Cl.² .................. H01L 21/203; H01L 29/207
[52] U.S. Cl. .................... 148/175; 29/576 E; 148/1.5; 148/174; 156/606; 156/610; 427/85; 427/87
[58] Field of Search ............. 148/1.5, 174, 175; 156/605, 606, 610; 29/576 E; 427/85, 87

[56] References Cited

U.S. PATENT DOCUMENTS

| | | | |
|---|---|---|---|
| 2,994,621 | 8/1961 | Hugle et al. | 148/175 X |
| 3,716,424 | 2/1973 | Schoolar | 148/175 |
| 3,751,310 | 8/1973 | Cho | 148/175 |
| 3,839,084 | 10/1974 | Cho et al. | 427/87 X |
| 3,915,765 | 10/1975 | Cho et al. | 156/610 X |
| 3,941,624 | 3/1976 | Cho | 148/175 |

OTHER PUBLICATIONS

Cho et al., "Molecular Beam Epitaxy of GaAs, AlGaAs and GaP" 1970 Symposium on GaAs, Paper No. 2, pp. 18-29.
Arthur, J. R., "Adsorption of Zm on GaAs" Surface Science, vol. 38, 1973, pp. 394–412.
Cho et al., "Molecular Beam Epitaxy" Progress in Solid State Chemistry, vol. 10, Part 3, pp. 157–191.

*Primary Examiner*—L. Dewayne Rutledge
*Assistant Examiner*—W. G. Saba
*Attorney, Agent, or Firm*—Thomas A. Briody; Jack Oisher; Paul R. Miller

[57] ABSTRACT

A method of growing an n-type GaAs layer on a substrate by a molecular beam epitaxy process, the dopant consisting of S, Se or Te. The layer is prepared by directing molecular beams of gallium, arsenic and PbX, where X is S, Se or Te, onto a heated substrate. It has not proved practicable to grow an n-type GaAs layer by molecular beam epitaxy using S, Se or Te as dopant in the form of a molecular beam consisting of elemental S, Se or Te.

3 Claims, 1 Drawing Figure

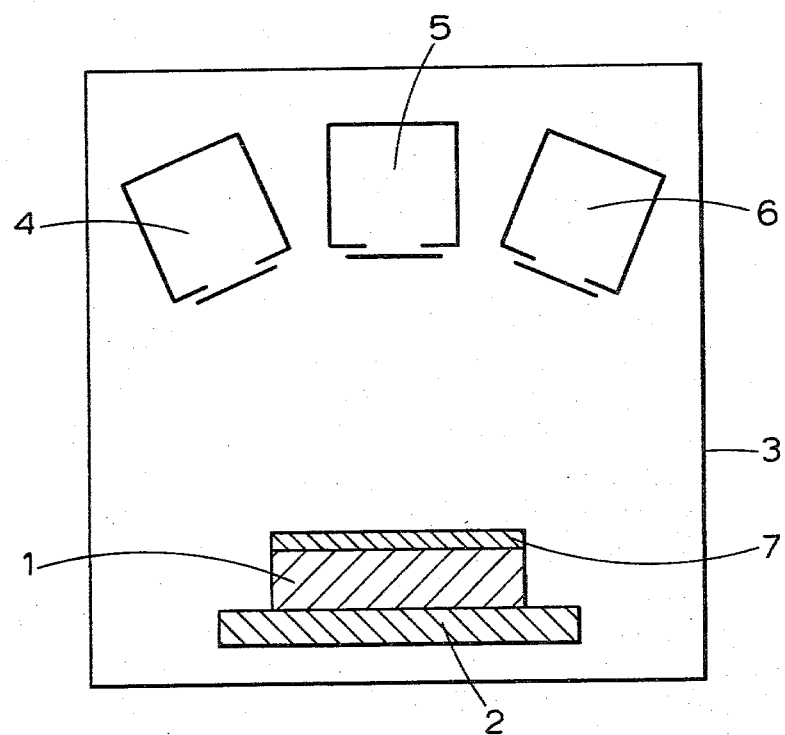

UTILIZING LEAD COMPOUNDS OF SULPHUR, SELENIUM AND TELLURIUM AS DOPANT SOURCES

The invention relates to a method of growing n-type gallium arsenide layers on substrates by molecular beam epitaxy, to substrates bearing n-type gallium arsenide layers grown by such methods, and to semiconductor devices including such substrates bearing such n-type gallium arsenide layers.

Although sulphur, selenium and tellurium are common dopants used in the growth of n-type gallium arsenide by liquid phase epitaxy or from melts, it is not evident that it is possible to successfully use an elemental source of sulphur, selenium or tellurium in the growth of n-type gallium arsenide by molecular beam epitaxy.

An article "Molecular Beam Epitaxy" by A. Y. Cho and J. R. Arthur, in Progress in Solid-State Chemistry, Vol. 10, Part 3, pages 157–191, reports that tellurium has been used as an n-type dopant, in GaAs grown by molecular beam epitaxy. However, although it is easy to dope GaAs grown by molecular beam epitaxy with tellurium, it was found to be difficult to control such doping. It appears that such a high concentration of tellurium is required in this process that gallium telluride is grown on the gallium arsenide.

Germanium acts as an amphoteric dopant in gallium arsenide grown by molecular beam epitaxy. A p-type doped GaAs layer can be grown if the growth conditions produce Ga-stabilized surface structures, while n-type doped GaAs layers result when As-stabilized surface structures are used.

The invention provides a method of growing an n-type GaAs layer on a substrate by a molecular beam epitaxy process, in which method molecular beams of gallium, arsenic and a compound defined by the formula PbX are directed onto a heated substrate surface, wherein X represents one of the elements sulphur, selenium and tellurium. The n-type GaAs layer produced may contain, for example, from $5 \times 10^{15}$ to $5 \times 10^{19}$ atoms of X per cm$^3$.

The method according to the invention makes it possible to use S, Se or Te as dopants to produce n-type GaAs by molecular beam epitaxy, should it be desirable to avoid using tin, silicon or germanium. The surface rate-limiting process for sulphur, selenium, or tellurium when using this technique, is much less significant than it is for tin or elemental tellurium.

It seems that quite abrupt changes in the doping-level can be produced when using the method according to the invention, typically in a thickness of about 200 Å, compared with a thickness of more than 0.1 μm when tin is used as an n-type dopant for gallium arsenide grown by molecular beam epitaxy. The advantage of producing abrupt changes in the doping-level is required in many semiconductor devices, such as varactors and mixer diodes, where a high to medium change in doping-level is required, IMPATT's (low-high-low) and FET's (very low-medium). Abrupt low to high changes in doping-level can be produced when tin is the dopant, but changes from high to low doping levels cannot be produced when using tin as the dopant with gallium arsenide grown by molecular beam epitaxy.

In a method according to the invention, the compound PbX reacts with the growing GaAs, and since lead is not incorporated into GaAs grown by molecular beam epitaxy presumably because lead is such a large atom compared to gallium or arsenic, the lead is desorbed from the growth surface, and only the desired element X is taken up by the GaAs, which is thus doped by the element X.

Two embodiments of the invention will now be described with reference to the following Examples and to the single FIGURE of the accompanying drawing, which schematically shows a molecular beam epitaxy apparatus.

EXAMPLE 1

A semi-insulating GaAs substrate 1 doped with 1 p.p.m. of chromium was etched in a mixture consisting of 15 volumes concentrated H$_2$SO$_4$ (96% by weight), 2 volumes hydrogen peroxide solution (30% by weight), and 2 volumes of water, rinsed and dried and was then mounted on a heater 2 in a vacuum chamber 3. Pressure in the vacuum chamber 3 was reduced to below $10^{-9}$ Torr, and an As$_4$ flux of $10^{15}$ molecules/cm$^2$/sec was directed at the surface of the substrate 1, the substrate 1 was then heated at 600° C. while the exposed surface of the substrate 1 was monitored by means of glancing-incidence reflection electron diffraction, heating being continued until the diffraction pattern showed the surface to be clean. The temperature of the substrate 1 was then reduced to 550° C., which was the temperature at which a sulphur doped (n-type) gallium arsenide layer 7 was grown. A 1 μm thick layer was grown in 1½ hours using fluxes of $5 \times 10^{14}$ molecules of Ga per sq.cm. per sec, $2 \times 10^{15}$ molecules of As$_4$ per sq.cm. per sec. and $5 \times 10^{11}$ molecules of PbS per sq.cm. per sec. generated by respective Knudsen cells 4, 5 and 6. The growth rate of the sulphur doped (n-type) gallium arsenide layer 7 was set by the Ga flux, as an excess of As$_4$ flux was used, the excess As$_4$ being reflected from the growth surface, and all the gallium incident on the growth surface stuck. The grown layer 7 contained $10^{17}$ atoms of sulphur per cubic cm.

EXAMPLE 2

A gallium arsenide layer 7 doped with selenium was grown by a process similar to that described in Example 1. A lead selenide flux of $5 \times 10^{11}$ molecules PbSe per sq.cm. per sec. was generated by means of the Knudsen cell 5, the other details of the process being as described in Example 1. The grown layer 7 contained $10^{17}$ atoms per cubic cm. of selenium.

Methods according to the invention may be used, for example in the manufacture of varactors, where first a 2 μm layer of heavily doped ($5 \times 10^{18}$ atoms per cubic cm) gallium arsenide is grown, and then a ¼ μm layer of medium doped ($1 \times 10^{17}$ atoms per cubic cm.) gallium arsenide is grown. When making FET's ½ μm layer of undoped gallium arsenide is grown, and a method according to the invention may then be used to grow a 0.2 μm layer of medium doped ($1 \times 10^{17}$ atoms per cubic cm) gallium arsenide.

We claim:

1. A method of growing an n-type GaAs layer on a substrate by molecular beam epitaxy comprising the step of directing respective molecular beams of gallium, arsenic and a compound defined by PbX onto a heated substrate surface, wherein X represents one of the elements sulphur, selenium and tellurium.

2. A method according to claim 1, wherein the grown n-type GaAs layer contains from $5 \times 10^{15}$ to $5 \times 10^{19}$ atoms of X per cm$^3$.

3. A method according to claim 1, wherein abrupt changes in doping level of said n-type GaAs layer is carried out by changes in the amount of X.

* * * * *